(12) United States Patent
Tang et al.

(10) Patent No.: US 12,210,394 B2
(45) Date of Patent: Jan. 28, 2025

(54) CHASSIS AND STORAGE DEVICE

(71) Applicant: Huawei Technologies Co., Ltd., Shenzhen (CN)

(72) Inventors: Yinzhong Tang, Dongguan (CN); Ming Chen, Chengdu (CN); Hengchao Wang, Shenzhen (CN); Xiaochuan Li, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 238 days.

(21) Appl. No.: 17/866,067

(22) Filed: Jul. 15, 2022

(65) Prior Publication Data
US 2022/0350380 A1    Nov. 3, 2022

Related U.S. Application Data

(63) Continuation of application No. PCT/CN2020/140976, filed on Dec. 29, 2020.

(30) Foreign Application Priority Data

Jan. 16, 2020  (CN) .......................... 202010044807.0
Feb. 10, 2020  (CN) .......................... 202010085251.X

(51) Int. Cl.
*G06F 1/20*    (2006.01)
*G06F 1/18*    (2006.01)
*H05K 7/20*    (2006.01)

(52) U.S. Cl.
CPC ............... *G06F 1/20* (2013.01); *G06F 1/187* (2013.01); *H05K 7/20145* (2013.01)

(58) Field of Classification Search
CPC combination set(s) only.
See application file for complete search history.

(56) References Cited

U.S. PATENT DOCUMENTS 8,009,385 B2 * 8/2011 Starr ..................... G11B 33/125
                                                    360/98.06
8,328,026 B2 * 12/2012 Boduch ................ H05K 7/1425
                                                    211/26
8,335,076 B2 * 12/2012 Zhang ..................... G06F 1/184
                                                    174/559

(Continued)

FOREIGN PATENT DOCUMENTS

CN     200972785 Y    11/2007
CN     203338221 U    12/2013
(Continued)

*Primary Examiner* — Lisa Lea-Edmonds
(74) *Attorney, Agent, or Firm* — Conley Rose, P.C.

(57) ABSTRACT

A chassis includes a chassis body and a support, and the chassis body has a channel that passes through a first end and a second end that are of the chassis body. The support is slidably disposed in the channel. The support is provided with a first accommodation compartment, a fan compartment, and a second accommodation compartment that are successively disposed along a direction from a first end of the channel to a second end of the channel. The first accommodation compartment is capable of sliding out of the chassis body from the first end, and the second accommodation compartment is capable of sliding out of the chassis body from the second end. The fan compartment is configured to accommodate a heat dissipation fan.

20 Claims, 3 Drawing Sheets

(56) References Cited

U.S. PATENT DOCUMENTS

| | | | | |
|---|---|---|---|---|
| 8,493,734 B2* | 7/2013 | Chien | ............... | G06F 1/187 |
| | | | | 174/547 |
| 9,066,444 B2* | 6/2015 | Adrian | ............... | H05K 7/20736 |
| 9,214,194 B2* | 12/2015 | Petruzzo | ............... | G06F 1/20 |
| 9,326,420 B2* | 4/2016 | Zhang | ............... | H05K 7/2039 |
| 9,763,350 B2* | 9/2017 | Rust | ............... | G11B 33/126 |
| 10,073,502 B2* | 9/2018 | Petruzzo | ............... | G11B 33/128 |
| 2004/0264145 A1* | 12/2004 | Miller | ............... | H05K 7/1489 |
| | | | | 361/725 |
| 2007/0247804 A1* | 10/2007 | Li | ............... | G11B 33/126 |
| | | | | 361/679.48 |
| 2008/0217962 A1* | 9/2008 | Boduch | ............... | H05K 5/0213 |
| | | | | 296/204 |
| 2012/0250247 A1* | 10/2012 | Chien | ............... | G06F 1/187 |
| | | | | 361/679.48 |
| 2016/0219748 A1* | 7/2016 | Tsai | ............... | H05K 7/1487 |
| 2017/0315597 A1* | 11/2017 | Petruzzo | ............... | G06F 1/181 |
| 2021/0074331 A1* | 3/2021 | Wang | ............... | G11B 33/126 |
| 2022/0350377 A1* | 11/2022 | Tang | ............... | G06F 1/187 |
| 2022/0350380 A1* | 11/2022 | Tang | ............... | H05K 7/1489 |

FOREIGN PATENT DOCUMENTS

| | | |
|---|---|---|
| CN | 205620909 U | 10/2016 |
| CN | 208207712 U | 12/2018 |
| CN | 109557984 A | 4/2019 |
| CN | 109618527 A | 4/2019 |
| JP | 2016081227 A | 5/2016 |

* cited by examiner

CHASSIS AND STORAGE DEVICE

CROSS-REFERENCE TO RELATED APPLICATIONS

This is a continuation of International Patent Application No. PCT/CN2020/140976 filed on Dec. 29, 2020, which claims priority to Chinese Patent Application No. 202010044807.0 filed on Jan. 16, 2020 and Chinese Patent Application No. 202010085251.X filed on Feb. 10, 2020. All of the aforementioned patent applications are hereby incorporated by reference in their entireties.

TECHNICAL FIELD

This disclosure relates to the field of information technologies, and in particular, to a chassis and a storage device.

BACKGROUND

As data grows in amount, a user has a higher requirement for a storage capability of a storage device. In the storage device, a storage capacity is a key factor that affects the storage capability of the storage device. Simply speaking, a capacity of a single hard disk and a quantity of hard disks determine the storage capacity of the storage device. With increases in the quantity of hard disks and power consumption, the industry also has a higher requirement for heat dissipation performance of the storage device. However, a structure of a chassis has a relatively great impact on the heat dissipation performance of the storage device. Therefore, how to properly configure the structure of the chassis is a key factor for improving the storage performance and the heat dissipation performance of the storage device.

SUMMARY

This disclosure provides a chassis and a storage device that can effectively ensure heat dissipation.

In one aspect, this disclosure provides a chassis for accommodating, supporting or fastening electrical elements. Further, the chassis may include a chassis body and a support located in the chassis body. An electrical element may be fastened on the support. When the support is located in the chassis body, the chassis body can provide a protection function or airtightness for the support and the electrical element fastened on the support. For ease of maintenance, in the chassis provided in this disclosure, the chassis body has a channel that passes through a first end and a second end that are of the chassis body, and the support is slidably disposed in the channel of the chassis body. In addition, for ease of installation and heat dissipation of the electrical elements, a first accommodation compartment, a fan compartment, and a second accommodation compartment are disposed in the support, and the first accommodation compartment, the fan compartment, and the second accommodation compartment are successively disposed along a direction from a first end of the channel to a second end of the channel. When the support slides out from the first end of the chassis body (or the channel), the first accommodation compartment can be exposed outside the chassis body, so that a user maintains an electrical element in the first accommodation compartment. When the support slides out from the second end of the chassis body (or the channel), the second accommodation compartment can be exposed outside the chassis body, so that the user maintains an electrical element in the second accommodation compartment. The fan compartment is configured to install a heat dissipation fan. Further, when the support does not slide out of the chassis body, the heat dissipation fan generates a pressure difference through rotation of the heat dissipation fan. Air outside the chassis body is capable of entering the accommodation compartment from the first end of the chassis body, flowing to the second accommodation compartment after passing through the fan compartment, and finally being discharged from the second end of the chassis body. In other words, cooling airflow generated by the heat dissipation fan is capable of entering the first accommodation compartment from the first end of the chassis body, flowing to the second accommodation compartment through the fan compartment, and being discharged from the second end of the chassis body. The heat dissipation fan can generate cooling airflow that passes through the first end and the second end that are of the channel, and the cooling airflow can flow through the first accommodation compartment and the second accommodation compartment, so that good heat dissipation can be achieved for the electrical elements in the first accommodation compartment and the second accommodation compartment.

In addition, in some implementations, an additional accommodation compartment may be further disposed in the chassis. For example, in an implementation provided in this disclosure, an auxiliary accommodation compartment is further disposed. The auxiliary accommodation compartment may be disposed between a periphery of the support and the chassis body, and the auxiliary accommodation compartment passes through the first end and the second end that are of the chassis body. A baffle plate is disposed in the auxiliary accommodation compartment, the baffle plate is disposed in projection of the fan compartment in the auxiliary accommodation compartment, and the baffle plate divides the auxiliary accommodation compartment into a third accommodation compartment and a fourth accommodation compartment. The third accommodation compartment is located on one side of the first accommodation compartment, and the fourth accommodation compartment is located on one side of the second accommodation compartment. Further, the first accommodation compartment is provided with a first connection port, and the second accommodation compartment is provided with a second connection port. When the support does not slide out of the chassis body, the first accommodation compartment communicates with the third accommodation compartment through the first connection port, and the second accommodation compartment communicates with the fourth accommodation compartment through the second connection port. A part of the cooling airflow generated by the heat dissipation fan is capable of entering the first accommodation compartment from the first end of the chassis body, flowing to the second accommodation compartment through the fan compartment, and being discharged from the second end of the chassis body. The other part of the cooling airflow is capable of entering the third accommodation compartment from the first end of the chassis body, entering the first accommodation compartment through the first connection port, flowing to the second accommodation compartment through the fan compartment, then being discharged into the fourth accommodation compartment through the second connection port, and being discharged from the second end of the chassis body. The cooling airflow generated by the heat dissipation fan can have good heat dissipation on the first accommodation compartment, the second accommodation compartment, the third accommodation compartment, and the fourth accommodation compartment by disposing this structure.

Therefore, this helps improve heat dissipation performance of the chassis body. In a specific implementation, the first connection port is disposed on a side wall of the first accommodation compartment, and the second connection port is disposed on a side wall of the second accommodation compartment. Alternatively, the first connection port is disposed at the bottom of the first accommodation compartment, and the second connection port is disposed at the bottom of the second accommodation compartment. Alternatively, one connection port is on a side wall, and the other connection port is at the bottom.

When the first accommodation compartment in the support is pulled out from the first end of the chassis body, to ensure continuity of heat dissipation, in an implementation provided in this disclosure, a backflow prevention plate is further disposed in the chassis. In a specific implementation, the backflow prevention plate is rotatably disposed in the channel, and after the first accommodation compartment slides out of the chassis body, the backflow prevention plate blocks a second end of the second accommodation compartment. In this case, the cooling airflow generated by the heat dissipation fan is capable of flowing from the first accommodation compartment to the second accommodation compartment through the fan compartment, then being discharged into the fourth accommodation compartment through the channel, and being discharged from the second end of the chassis body.

When the second accommodation compartment in the support is pulled out from the second end of the chassis body, to ensure continuity of heat dissipation, in another implementation provided in this disclosure, after the second accommodation compartment slides out of the chassis body, the second accommodation compartment may be connected to the fourth accommodation compartment through the first connection port, a part of the cooling airflow generated by the heat dissipation fan is capable of entering the first accommodation compartment from the first end of the chassis body through the channel, flowing to the second accommodation compartment through the fan compartment, and then being discharged. The other part of the cooling airflow is capable of entering the fourth accommodation compartment from the second end of the chassis body, entering the first accommodation compartment through the first connection port, flowing to the second accommodation compartment through the fan compartment, and then being discharged.

In addition, in a specific implementation, there may be various types of channels.

For example, the channel may be in a straight line shape. The support can slide along a straight path in the channel. In addition, the channel may alternatively be in an arc shape. The support can slide along an arc path in the channel.

In some implementations, a length of the first accommodation compartment and a length of the second accommodation compartment may be diversified. For example, the length of the first accommodation compartment may be the same as the length of the second accommodation compartment. Alternatively, the first accommodation compartment and the second accommodation compartment may be symmetrically disposed with respect to the fan compartment. In some other implementations, the length of the first accommodation compartment may alternatively be greater than or less than the length of the second accommodation compartment.

In addition, this disclosure further provides a storage device, including any one of the foregoing chassis. A heat dissipation fan is installed in a heat dissipation compartment in the chassis, and hard disks are installed in a first accommodation compartment and a second accommodation compartment. Further, the storage device further includes a circuit board assembly. In a specific implementation, the circuit board assembly may be disposed in various manners. For example, the circuit board assembly may include a control board assembly and/or a power module. The circuit board assembly may be electrically connected to the hard disks in a support through cables. In addition, to improve reliability of the cables, the cables may be installed on a tank chain. One end of the tank chain may be fixedly connected to the support, and the other end of the tank chain may be fixedly connected to a chassis body. When the support slides relative to the chassis body, the tank chain can protect the cables well, and prevent the cables from tangling, wearing, pulling out, and other undesirable phenomena. Further, the circuit board assembly may be installed in an auxiliary accommodation compartment. Further, the control board assembly may be fastened on an inner side surface or an inner bottom wall of the chassis body.

DESCRIPTION OF EMBODIMENTS

Figure 1:
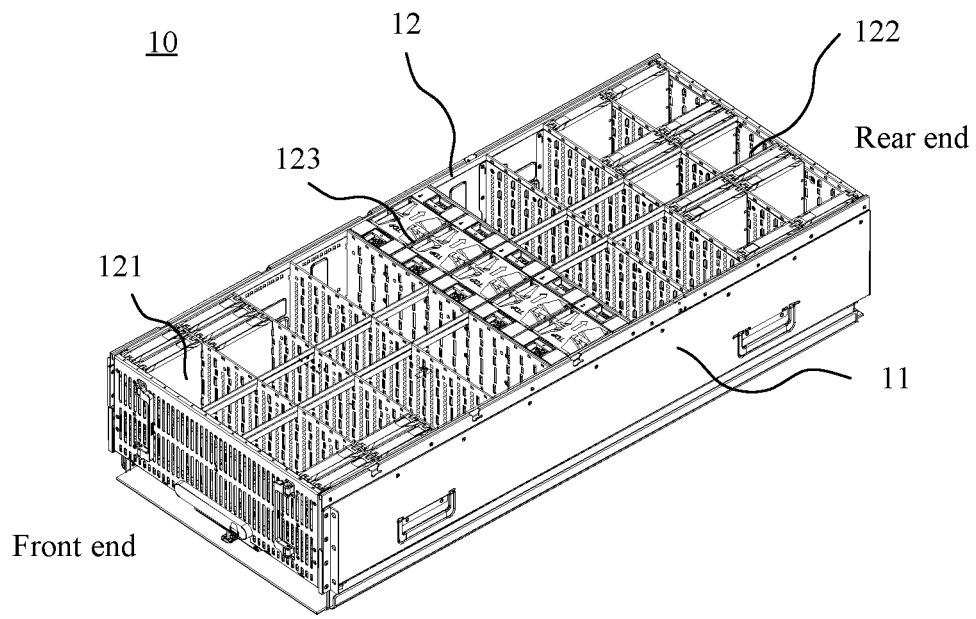
FIG. 1 is a schematic diagram of a three-dimensional structure obtained when a support in a chassis is not pulled out according to an embodiment of this disclosure.

To make objectives, technical solutions, and advantages of this disclosure clearer, the following further describes this disclosure in detail with reference to accompanying drawings.

To facilitate understanding of a chassis provided in embodiments of this disclosure, the following first describes an application scenario of the chassis.

The chassis provided in the embodiments of this disclosure may be used in a plurality of types of electronic devices, and is configured to accommodate, support, or fasten electrical elements in the electronic devices. For example, the chassis may be used in a storage device. Further, the storage device may include hard disks (which may be storage components such as a hard disk drive or a solid-state drive), a circuit board assembly, and a heat dissipation fan. The hard disks, the circuit board assembly, and the heat dissipation fan may be fastened in the chassis, and the chassis may provide a protection function for the hard disks, the circuit board assembly, and the heat dissipation fan, to improve security of the storage device. In a specific implementation, the hard disk is configured to store data to implement a storage function of the storage device. The circuit board assembly is electrically connected to the hard disks to implement functions such as power supply, data distribution, and data reading for the hard disks. The heat dissipation fan can generate cooling airflow to dissipate heat for the hard disks and the circuit board assembly, so as to ensure normal running of the storage device. The circuit board assembly may be electrically connected to the hard disks through cables.

In some implementations, the chassis may include a chassis body and a support located in the chassis body, and the support is drawably disposed in the chassis body. The hard disks and the circuit board assembly may be disposed in the support. When the hard disk or the circuit board assembly needs to be maintained, the support may be pulled out from the chassis body, to facilitate an operation of a user. In some storage devices, hard disks may be disposed at a front end (or a pulling end) of a support, a circuit board assembly may be disposed at a rear end (an end far away from the pulling end) of the support, and a heat dissipation fan may be disposed between the hard disks and the circuit board assembly. Under action of the heat dissipation fan, cooling airflow may enter from the front end of the support and be discharged from the rear end of the support. In actual use, after the support is pulled out from the chassis body, a cantilever structure is formed between the support and the chassis body. Therefore, if a pull-out length of the support is relatively long, there is a relatively high risk of toppling. In addition, after the support is pulled out, a pulling structure (for example, a guide rail or a chute) between the support and the chassis body bears a relatively large torque, and risks such as invalid are likely to occur. In addition, if a pulling structure with higher stress strength is used, purchase (or manufacturing) costs significantly increase, and market competitiveness of the chassis is reduced. In addition, in actual application, storage devices are arranged in columns in an equipment room, and a channel may be formed between two columns of storage devices, to facilitate user walking. However, during maintenance, after a support is entirely pulled out from a chassis body, a pull-out length needs to be not greater than a width of the channel. Therefore, a minimum width of the channel usually depends on a maximum pull-out length of the support. This is not conducive to implementing minimum configuration of the channel and increasing space utilization of the equipment room.

Based on the foregoing problems existing in a current storage device, an embodiment of this disclosure provides a chassis that can reduce a pull-out length of a support.

To clearly understand the technical solutions of this disclosure, the following describes in detail the chassis provided in this disclosure with reference to specific embodiments and the accompanying drawings.

Terms used in the following embodiments are merely intended to describe specific embodiments, but are not intended to limit this disclosure. Terms "one", "a", "the", "the foregoing", "this", and "the one" of singular forms used in this specification and the appended claims of this disclosure are also intended to include plural forms like "one or more", unless otherwise specified in the context clearly. It should be further understood that, in the following embodiments of this disclosure, "at least one" or "one or more" means one, two, or more. The term "and/or" is used to describe an association relationship between associated objects and indicates that three relationships may exist. For example, A and/or B may indicate the following three cases: only A exists, both A and B exist, and only B exists, where A and B may be singular or plural. The character "/" generally indicates an "or" relationship between the associated objects.

Reference to "an embodiment", "some embodiments", or the like described in this specification indicates that one or more embodiments of this disclosure include a specific feature, structure, or characteristic described with reference to the embodiments. Therefore, in this specification, statements, such as "in an embodiment", "in some embodiments", "in some other embodiments", and "in other embodiments", that appear at different places do not necessarily mean referring to a same embodiment. Instead, the statements mean referring to "one or more but not all of the embodiments", unless otherwise further emphasized in other ways. The terms "include", "comprise", "have", and variants of the terms all mean "include but are not limited to", unless otherwise further emphasized in other ways.

Figure 2:
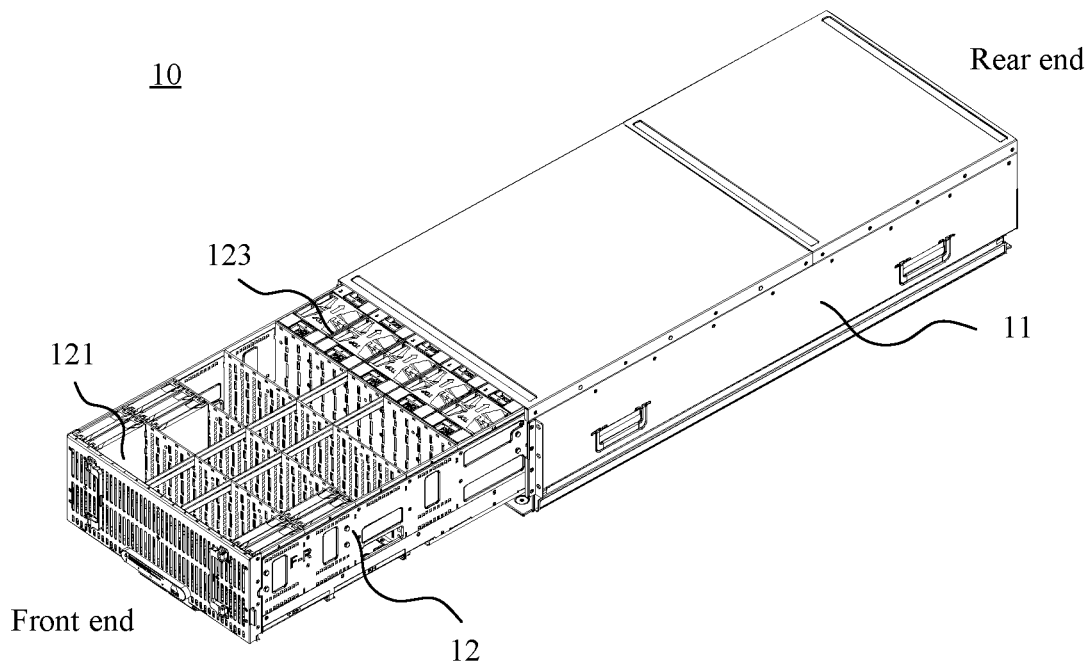
FIG. 2 is a schematic diagram of a three-dimensional structure obtained after a support in a chassis is pulled out from a front end according to an embodiment of this disclosure.
Figure 3:
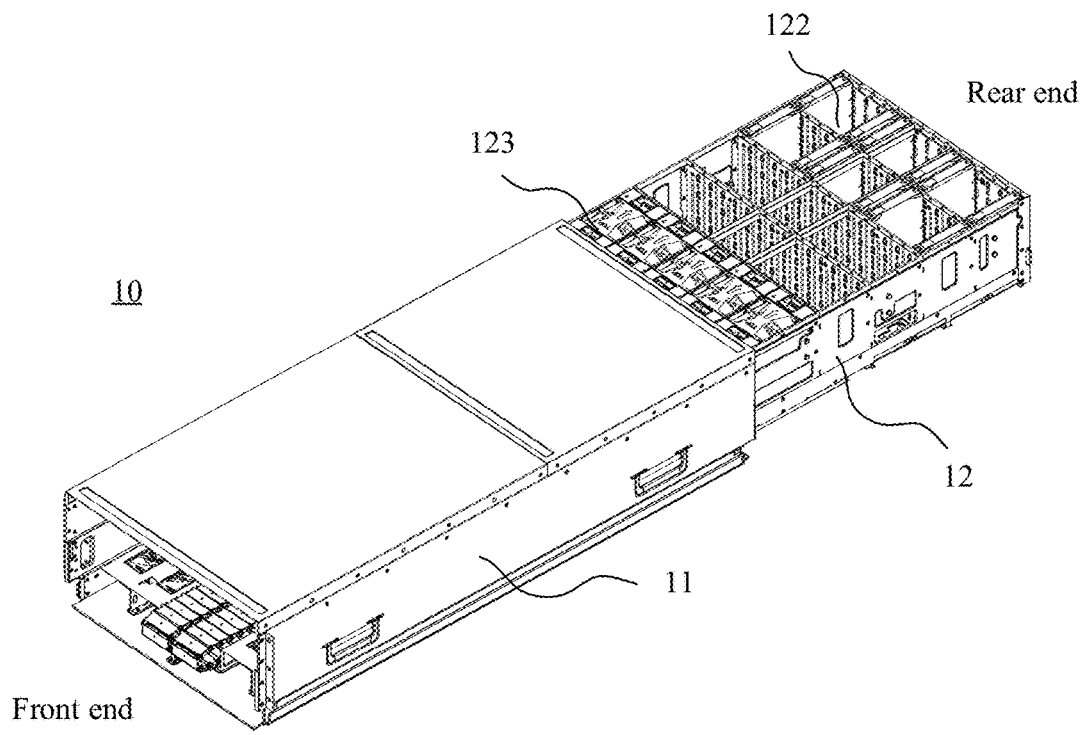
FIG. 3 is a schematic diagram of a three-dimensional structure obtained after a support in a chassis is pulled out from a rear end according to an embodiment of this disclosure.

As shown in FIG. 1, in an embodiment provided in this disclosure, to clearly show a structure of a support 12, a structure of the top of a chassis body 11 is omitted in FIG. 1. A chassis 10 includes the chassis body 11 and the support 12 located in the chassis body 11. The support 12 includes a first accommodation compartment 121 and a second accommodation compartment 122 that are used to accommodate electrical elements, and the support 12 may be disposed in the chassis body 11 in a bi-directional pulling manner. Further, as shown in FIG. 2, the support 12 may be pulled out from a first end (or a front end) of the chassis body 11. After the support 12 is pulled out, the first accommodation compartment 121 may be exposed outside the chassis body 11, and a user may perform work such as maintenance on the electrical element accommodated in the first accommodation compartment 121. In addition, as shown in FIG. 3, the support 12 may alternatively be pulled out from a second end (or a rear end) of the chassis body 11. After the support 12 is pulled out from the second end of the chassis body 11, the second accommodation compartment 122 may be exposed outside the chassis body 11, and the user may perform work such as maintenance on the electrical element accommodated in the second accommodation compartment 122. A pull-out length of the support 12 can be effectively reduced by using the foregoing arrangement manner. Further, if a length of the first accommodation compartment 121 is L1, and a length of the second accommodation compartment 122 is L2, a total length of the first accommodation compartment 121 and the second accommodation compartment 122 is: L1+L2=L3. If the chassis 10 uses the foregoing bi-directional pulling manner, a pull-out maximum length of the support 12 may be not greater than L1 or L2, and is less than L3. Therefore, after the support 12 is pulled out, a relatively large torque is not generated for a pulling structure between the support 12 and the chassis body 11. This helps reduce manufacturing or purchase costs of the pulling structure and improve market competitiveness of the chassis body 11. In this way, more electrical elements may be installed on the support 12. In addition, in actual application, because the pull-out maximum length of the support 12 is effectively shortened, when a plurality of chassis bodies 11 are placed in an application site, for example, an equipment room, in a centralized manner, a distance between two chassis bodies 11 that are placed oppositely (for example, front ends of the two chassis bodies 11 are placed oppositely and at intervals) may be effectively shortened. In this way, space utilization of the application site, for example, the equipment room, is increased. The electrical element may be a hard disk, a computing blade, or the like. This is not limited in this embodiment of the present disclosure.

In a specific implementation, the length of the first accommodation compartment 121 may be the same as or different from the length of the second accommodation compartment 122.

Figure 4:
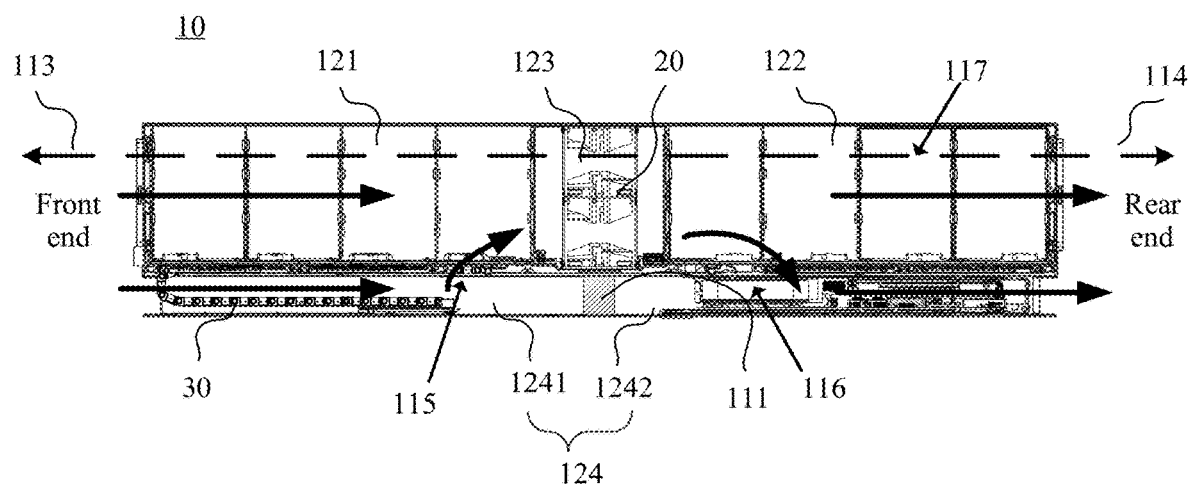
FIG. 4 is a schematic diagram of a cross-sectional structure obtained when a support in a chassis is not pulled out according to an embodiment of this disclosure.

For example, in an embodiment provided in this disclosure, the length of the first accommodation compartment 121 is the same as the length of the second accommodation compartment 122. A fan compartment 123 is disposed between the first accommodation compartment 121 and the second accommodation compartment 122, and the first accommodation compartment 121 and the second accommodation compartment 122 are symmetrically disposed with respect to the fan compartment 123. The fan compartment 123 may accommodate a heat dissipation fan. Referring to FIG. 4, when the support 12 is not pulled out from the chassis body 11, airflow generated by the cooling fan may enter from the front end of the chassis body 11 and be discharged from the rear end of the chassis body 11. Alternatively, in some implementations, the airflow generated by the cooling fan may enter the rear end of the chassis body 11 and be discharged from the front end of the chassis body 11, to dissipate heat for the electrical elements in the first accommodation compartment 121 and the second accommodation compartment 122.

In some implementations, an accommodation compartment configured to accommodate some electrical elements may be further disposed between a periphery of the support 12 and an inner wall of the chassis body 11. For example, in an embodiment provided in this disclosure, an auxiliary accommodation compartment 124 is disposed between the periphery of the support 12 and the inner wall of the chassis body 11. A storage device is used as an example. In a specific application, a circuit board assembly may be disposed in the auxiliary accommodation compartment 124. The circuit board assembly may be fastened on the periphery of the support 12, or may be fastened on the inner wall of the chassis body 11. Alternatively, some components in the circuit board assembly may be fastened on the periphery of the support 12, and the other components may be fastened on the inner wall of the chassis body 11. The circuit board assembly may be electrically connected to the hard disks through cables.

In a specific implementation, a disposition position of the auxiliary accommodation compartment 124 may be properly selected based on shapes of the chassis body 11 and the support 12, a disposition position of the pulling structure, and the like.

For example, as shown in FIG. 2 and FIG. 3, in an embodiment provided in this disclosure, the chassis body 11 may be a rectangular housing structure in which front and rear ends are connected, and the support 12 may be a rectangular cube frame structure. A left side of the support 12 is connected to a left side wall of the chassis body 11 by using a pulling structure (not shown in the figure), and a right side of the support 12 is connected to a right side wall of the chassis body 11 by using a pulling structure (not shown in the figure). The support 12 may be pulled out from the front end of the chassis body 11, or may be pulled out from the rear end of the chassis body 11. The first accommodation compartment 121, the fan compartment 123, and the second accommodation compartment 122 are sequentially arranged from a front end of the support 12 to a rear end of the support 12. The auxiliary accommodation compartment 124 is disposed in a gap between a lower side of the support 12 and a bottom wall of the chassis body 11, so that space utilization of the chassis 10 can be increased. In some other implementations, the shapes of the chassis body 11 and the support 12 are not limited to the foregoing rectangular structures. For example, the chassis body 11 may alternatively be a pillar structure whose cross section is a circle, a triangle, or another polygon. The chassis body 11 may be a cube structure in a spherical shape, a trapezoid shape, or the like. In addition, structures of channels formed in the chassis body 11 may also be diversified. For example, the channel may be in a straight line shape, or may be in an arc shape. This is not limited in this disclosure.

The following describes in detail a heat dissipation process in the chassis 10.

As shown in FIG. 4, when the support 12 is not pulled out from the chassis body 11, under action of a heat dissipation fan 20, cooling airflow (represented by a thick solid line with an arrow in the figure) enters the chassis body 11 from the front end of the chassis body 11, and is discharged from the chassis body 11 from the rear end of the chassis body 11. The cooling airflow can pass from a first end 113 of the channel 117 though a second end 114 of the channel 117. In this process, the airflow successively flows through the first accommodation compartment 121, the fan compartment 123, and the second accommodation compartment 122, to dissipate heat for the electrical elements disposed in the first accommodation compartment 121 and the second accommodation compartment 122.

In some implementations, to enable the airflow generated by the heat dissipation fan 20 to flow through the auxiliary accommodation compartment 124, in an embodiment provided in this disclosure, a baffle plate 111 is disposed in the middle of the auxiliary accommodation compartment 124 (or below the fan compartment 123), and the baffle plate 111 divides the auxiliary accommodation compartment 124 into a third accommodation compartment 1241 and a fourth accommodation compartment 1242. The third accommodation compartment 1241 is located below the first accommodation compartment 121, and the first accommodation compartment 121 is provided with a first connection port 115. The first accommodation compartment 121 may be connected to the third accommodation compartment 1241 through the first connection port 115. The fourth accommodation compartment 1242 is located below the second accommodation compartment 122, and the second accommodation compartment 122 is provided with a second connection port 116. The second accommodation compartment 122 may be connected to the fourth accommodation compartment 1242 through the second connection port 116. Further, under the action of the heat dissipation fan 20, the cooling airflow enters the chassis body 11 from the front end of the chassis body 11, and is discharged from the chassis body 11 from the rear end of the chassis body 11. In this process, when the support 12 does not slide out of any end of the chassis, the airflow has two paths. A first path successively flows through the first accommodation compartment 121, the fan compartment 123, and the second accommodation compartment 122. A second path successively flows through the third accommodation compartment 1241, the first connection port 115, the fan compartment 123, the second connection port 116, and the fourth accommodation compartment 1242. The cooling airflow generated by the heat dissipation fan 20 can effectively flow through the first accommodation compartment 121, the second accommodation compartment 122, the third accommodation compartment 1241, and the fourth accommodation compartment 1242 by disposing this structure, so that the chassis 10 has a good heat dissipation capability. In a specific implementation, the first connection port 115 is disposed on a side wall of the first accommodation compartment 121, and the second connection port 116 is disposed on a side wall of the second accommodation compartment 122. Alternatively, the first connection port 115 is disposed at the bottom of the first accommodation compartment 121, and the second connection port 116 is disposed at the bottom of the second accommodation compartment 122. Alternatively, one connection port is on a side wall, and the other connection port is at the bottom. This is not limited in this embodiment of the present disclosure.

In addition, when the electrical elements in the first accommodation compartment 121 and the second accommodation compartment 122 are maintained, the support 12 needs to be pulled out outwards. To maintain the heat dissipation capability of the chassis 10, in an embodiment provided in this disclosure, the chassis 11 further includes a backflow prevention plate 112.

Figure 5:
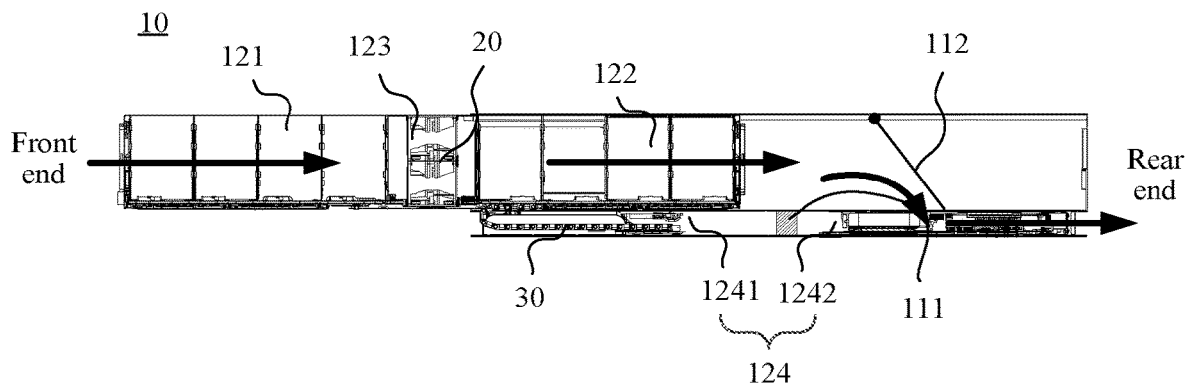
FIG. 5 is a schematic diagram of a cross-sectional structure obtained after a support in a chassis is pulled out from a front end according to an embodiment of this disclosure.

Further, as shown in FIG. 5, after the support 12 is pulled out from the front end of the chassis body 11, the backflow prevention plate 112 in the chassis body 11 blocks a rear end of the second accommodation compartment 122, so that the cooling airflow can be discharged from a rear end of the fourth accommodation compartment 1242. Further, after the support 12 is pulled out from the front end of the chassis body 11, under the action of the heat dissipation fan 20, the airflow enters from a front end of the first accommodation compartment 121, flows through the first accommodation compartment 121, the fan compartment 123, and the second accommodation compartment 122, flows through the channel and fourth accommodation compartment 1242, and is discharged from the rear end. When the user pulls out the support 12 to maintain the electrical element in the first accommodation compartment 121, the airflow generated by the heat dissipation fan 20 can still flow well through the first accommodation compartment 121 and the second accommodation compartment 122. This can effectively ensure continuous heat dissipation of the heat dissipation fan 20. In a specific implementation, the backflow prevention plate 112 may be disposed in various manners. For example, the top of the backflow prevention plate 112 may be fastened on an inner top wall of the chassis body 11 through a pin shaft, and under action of gravity, the backflow prevention plate 112 tends to flip downwards, so that after the support 12 is pulled out from the front end of the chassis body 11, the backflow prevention plate 112 can be flipped downwards under the action of gravity of the backflow prevention plate 112. In addition, in some implementations, to improve reliability of the backflow prevention plate 112, an elastic member may be disposed. For example, an elastic member, for example, a torsion spring, may be sleeved on a periphery of the pin shaft. One end of the torsion spring may be connected to the chassis body 11, and the other end may be connected to the backflow prevention plate 112. Under elastic force of the torsion spring, the backflow prevention plate 112 tends to flip downwards to block the rear end of the second accommodation compartment 122. In other implementations, after the support 12 is pulled out from the front end of the chassis body 11, the rear end of the second accommodation compartment 122 may alternatively be blocked by using another mechanical structure, to block the rear end of the second accommodation compartment 122, so that the cooling airflow can flow through the fourth accommodation compartment 1242. This is not limited in this disclosure.

Figure 6:
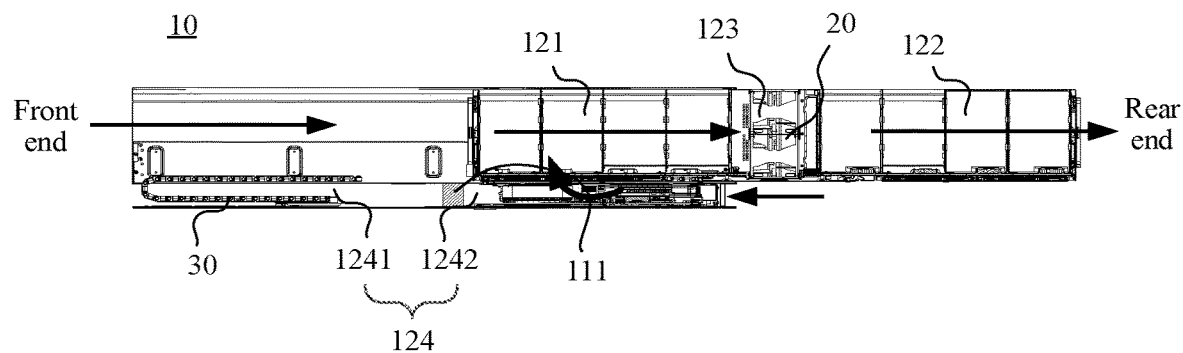
FIG. 6 is a schematic diagram of a cross-sectional structure obtained after a support in a chassis is pulled out from a rear end according to an embodiment of this disclosure.

In addition, as shown in FIG. 6, after the support 12 is pulled out from the rear end of the chassis body 11, the first connection port is located at a position in which the first accommodation compartment 121 communicates with the fourth accommodation compartment 1242, so that the first accommodation compartment 121 communicates with the fourth accommodation compartment 1242. Under the action of the heat dissipation fan 20, a part of the cooling airflow enters the first accommodation compartment 121 from the front end of the chassis body 11 through the channel, then flows to the second accommodation compartment 122 through the fan compartment 123, and is discharged. The other part of the cooling airflow enters the fourth accommodation compartment 1242 from the rear end of the chassis body 11, enters the first accommodation compartment 121 after passing through the first connection port, flows to the second accommodation compartment 122 through the fan compartment 123, and finally is discharged. When the user pulls out the support 12 to maintain the electrical element in the second accommodation compartment 122, the airflow generated by the heat dissipation fan 20 can still flow well through the first accommodation compartment 121 and the second accommodation compartment 122. This can effectively ensure the continuous heat dissipation of the heat dissipation fan 20.

In another aspect, in a specific application, the chassis 10 may be used in a plurality of types of electronic devices such as a network device and a storage device.

Figure 7:
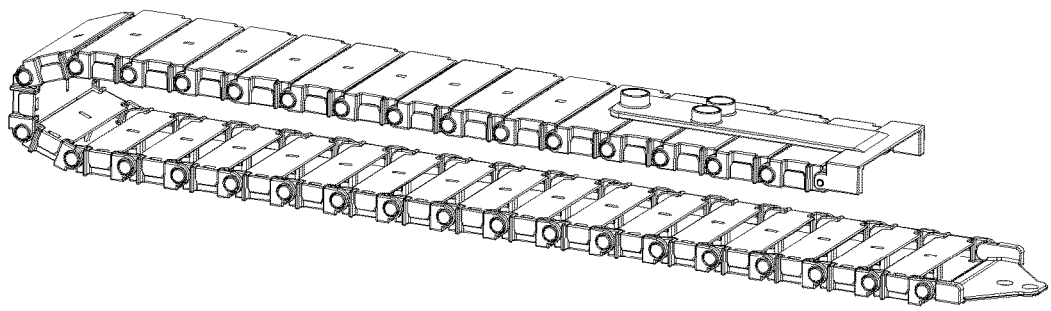
FIG. 7 is a schematic diagram of a three-dimensional structure of a tank chain according to an embodiment of this disclosure.

For example, the storage device may include any chassis 10 in the foregoing embodiments. A heat dissipation fan 20 is installed in the fan compartment 123 in the chassis 10, and hard disks are installed in the first accommodation compartment 121 and the second accommodation compartment 122. Further, the storage device may further include a circuit board assembly, and the circuit board assembly may be disposed in the auxiliary accommodation compartment 124. In a specific implementation, the circuit board assembly may be disposed in various manners. For example, in an implementation provided in this disclosure, the circuit board assembly may include a control board assembly and/or a power module. The circuit board assembly may be electrically connected to the hard disks in the first accommodation compartment 121 and/or the second accommodation compartment 122 through cables. Referring to FIG. 7, to improve reliability of the cables, in an embodiment provided in this disclosure, the circuit board assembly is installed in the auxiliary accommodation compartment 124, a tank chain 30 is disposed in the auxiliary accommodation compartment 124, one end of the tank chain 30 is fixedly connected to the support 12, and the other end of the tank chain 30 is fixedly connected to the chassis body 11. The cables are installed on the tank chain 30. When the support 12 slides relative to the chassis body 11, the tank chain 30 can protect the cables well, and prevent the cables from tangling, wearing, pulling out, and other undesirable phenomena. In an implementation, the circuit board assembly may be fastened to an inner bottom wall or an inner side surface of the chassis body 11. When the circuit board assembly is not in the auxiliary accommodation compartment, and the circuit board assembly is electrically connected to the hard disks through the cables, the tank chain may still be used to install the cables on the tank chain. The one end of the tank chain is connected to the chassis body, and the other end of the tank chain is fixedly connected to the support in the chassis.

In another embodiment, the chassis 10 may be used in a computing device. Computing blades are installed in the first accommodation compartment 121 and the second accommodation compartment 122, and a heat dissipation fan 20 is installed in the fan compartment 123. Further, the computing device may further include a circuit board assembly, and the circuit board assembly may be disposed in the auxiliary accommodation compartment 124. In a specific implementation, the circuit board assembly may be disposed in various manners. For example, in an implementation provided in this disclosure, the circuit board assembly may include a control board assembly and/or a power module. The circuit board assembly may be electrically connected to the computing blades in the first accommodation compartment 121 and/or the second accommodation compartment 122 through cables. Referring to FIG. 7, to improve reliability of the cables, in an embodiment provided in this disclosure, the circuit board assembly is installed in the auxiliary accommodation compartment 124, a tank chain 30 is disposed in the auxiliary accommodation compartment 124, one end of the tank chain 30 is fixedly connected to the support 12, and the other end of the tank chain 30 is fixedly connected to the chassis body 11. The cables are installed on the tank chain 30. When the support 12 slides relative to the chassis body 11, the tank chain 30 can protect the cables well, and prevent the cables from tangling, wearing, pulling out, and other undesirable phenomena. In an implementation, the circuit board assembly may be fastened to an inner bottom wall or an inner side surface of the chassis body 11. The control board assembly may be configured to manage the computing device. When the circuit board assembly is not in the auxiliary accommodation compartment, and the circuit board assembly is electrically connected to the computing blades through the cables, the tank chain may still be used to install the cables on the tank chain. The one end of the tank chain is connected to the chassis body, and the other end of the tank chain is fixedly connected to the support in the chassis.

In another embodiment, the chassis 10 may be used in an integrated device. Computing blades are installed in one of the first accommodation compartment 121 and the second accommodation compartment 122, and hard disks are installed in the other accommodation compartment. A heat dissipation fan 20 is installed in the fan compartment 123. Further, the integrated device may further include a circuit board assembly, and the circuit board assembly may be disposed in the auxiliary accommodation compartment 124. In a specific implementation, the circuit board assembly may be disposed in various manners. For example, in an implementation provided in this disclosure, the circuit board assembly may include a control board assembly and/or a power module. The circuit board assembly may be electrically connected to the computing blades and the hard disks in the accommodation compartments through cables. Referring to FIG. 7, to improve reliability of the cables, in an embodiment provided in this disclosure, the circuit board assembly is installed in the auxiliary accommodation compartment 124, a tank chain 30 is disposed in the auxiliary accommodation compartment 124, one end of the tank chain 30 is fixedly connected to the support 12, and the other end is fixedly connected to the chassis body 11. The cables are installed on the tank chain 30. When the support 12 slides relative to the chassis body 11, the tank chain 30 can protect the cables well, and prevent the cables from tangling, wearing, pulling out, and other undesirable phenomena. In an implementation, the circuit board assembly may be fastened to an inner bottom wall or an inner side surface of the chassis body 11. The circuit board assembly may be configured to manage the integrated device. In another implementation, the circuit board assembly may be electrically connected to the hard disks or the computing blades in the accommodation compartment through cables. When the circuit board assembly is not in the auxiliary accommodation compartment, and the circuit board assembly is electrically connected to the hard disks or the computing blades through the cables, the tank chain may still be used to install the cables on the tank chain. The one end of the tank chain is connected to the chassis body, and the other end of the tank chain is fixedly connected to the support in the chassis.

In another implementation, the computing blade in this embodiment of the present disclosure may be replaced with another electrical element, for example, a processor, and the hard disk may be replaced with an electrical element, for example, a storage blade. This is not limited in this embodiment of the present disclosure.

What is claimed is:

1. A chassis, comprising:
   a chassis body comprising:
   a first end;
   a second end; and
   a channel passing through the first end and the second end and comprising:
   a third end; and
   a fourth end; and
   a support slidably disposed in the channel and comprising:
   a first accommodation compartment configured to be slidingly moved out of the chassis body from the first end;
   a fan compartment configured to accommodate a heat dissipation fan; and
   a second accommodation compartment configured to be slidingly moved out of the chassis body from the second end,
   wherein the first accommodation compartment, the fan compartment, and the second accommodation compartment are successively disposed along a direction from the third end to the fourth end.

2. The chassis of claim 1, wherein the heat dissipation fan is configured to generate a cooling airflow that, when the first accommodation compartment and the second accommodation compartment are not slidingly moved out of the chassis body, is configured to enter the first accommodation compartment from the first end, flow to the second accommodation compartment through the fan compartment, and discharge from the second end.

3. The chassis of claim 1, further comprising:
   an auxiliary accommodation compartment disposed between a periphery of the support and the chassis body and passing through the first end and the second end; and
   a baffle plate disposed in the auxiliary accommodation compartment and further disposed on projection of the fan compartment on the auxiliary accommodation compartment, wherein the baffle plate divides the auxiliary accommodation compartment into:
   a third accommodation compartment that is located on one side of the first accommodation compartment; and
   a fourth accommodation compartment that is located on one side of the second accommodation compartment.

4. The chassis of claim 3, wherein the first accommodation compartment comprises a first connection port, wherein the second accommodation compartment comprises a second connection port, and wherein, when the first accommodation compartment and the second accommodation compartment are not slidingly moved out of the chassis body:
   the first accommodation compartment is coupled to the third accommodation compartment through the first connection port and the second accommodation compartment is coupled to the fourth accommodation compartment through the second connection port; and the heat dissipation fan is configured to generate a cooling airflow that comprises:
- a first portion configured to enter the first accommodation compartment from the first end, flow to the second accommodation compartment through the fan compartment, and discharge from the second end; and
- a second portion configured to enter the third accommodation compartment from the first end, enter the first accommodation compartment through the first connection port, flow to the second accommodation compartment through the fan compartment, discharge into the fourth accommodation compartment through the second connection port, and discharge from the second end.

5. The chassis of claim 3, wherein the chassis further comprises a backflow prevention plate rotatably disposed in the channel, and wherein when the first accommodation compartment is slidingly moved out of the chassis body:
- the backflow prevention plate blocks a fifth end of the second accommodation compartment; and
- the heat dissipation fan is configured to generate a cooling airflow that is configured to flow from the first accommodation compartment to the second accommodation compartment through the fan compartment, discharge into the fourth accommodation compartment through the channel, and discharge from the second end.

6. The chassis of claim 3, wherein the first accommodation compartment comprises a first connection port, and wherein, when the second accommodation compartment is slidingly moved out of the chassis body:
- the first accommodation compartment is coupled to the fourth accommodation compartment through the connection port; and
- the heat dissipation fan is configured to generate a cooling airflow that comprises:
  - a first portion configured to enter the first accommodation compartment from the first end through the channel, flow to the second accommodation compartment through the fan compartment, and then discharge; and
  - a second portion configured to enter the fourth accommodation compartment from the second end, enter the first accommodation compartment after passing through the first connection port, flow to the second accommodation compartment through the fan compartment, and then discharge.

7. The chassis of claim 1, wherein the channel is a straight channel.

8. The chassis of claim 1, wherein the channel is an arc channel.

9. The chassis of claim 1, wherein the first accommodation compartment and the second accommodation compartment are symmetrically disposed with respect to the fan compartment.

10. A storage device, comprising:
a heat dissipation fan;
a chassis comprising:
- a chassis body comprising:
  - a first end;
  - a second end; and
  - a channel passing through the first end and the second end and comprising:
    - a third end; and
    - a fourth end; and
- a support slidably disposed in the channel and comprising:
  - a first accommodation compartment configured to be slidingly moved out of the chassis body from the first end;
  - a fan compartment configured to accommodate the heat dissipation fan; and
  - a second accommodation compartment configured to be slidingly moved out of the chassis body from the second end,
  - wherein the first accommodation compartment, the fan compartment, and the second accommodation compartment are successively disposed along a direction from the third end to the fourth end; and
a plurality of hard disks installed in the first accommodation compartment and the second accommodation compartment.

11. The storage device of claim 10, wherein the heat dissipation fan is configured to generate a cooling airflow that, when the first accommodation compartment and the second accommodation compartment are not slidingly moved out of the chassis body, is configured to enter the first accommodation compartment from the first end, flow to the second accommodation compartment through the fan compartment, and discharge from the second end.

12. The storage device of claim 10, wherein the chassis further comprises:
- an auxiliary accommodation compartment disposed between a periphery of the support and the chassis body and passing through the first end and the second end; and
- a baffle plate disposed in the auxiliary accommodation compartment and further disposed on a projection of the fan compartment on the auxiliary accommodation compartment, wherein the baffle plate is configured to divide the auxiliary accommodation compartment into:
  - a third accommodation compartment that is located on one side of the first accommodation compartment; and
  - a fourth accommodation compartment that is located on one side of the second accommodation compartment.

13. The storage device of claim 12, wherein the first accommodation compartment comprises a first connection port, wherein the second accommodation compartment comprises a second connection port, and wherein, when the first accommodation compartment and the second accommodation compartment are not slidingly moved out of the chassis body:
- the first accommodation compartment is coupled to the third accommodation compartment through the first connection port and the second accommodation compartment is coupled to the fourth accommodation compartment through the second connection port; and
- the heat dissipation fan is configured to generate a cooling airflow that comprises:
  - a first portion configured to enter the first accommodation compartment from the first end, flow to the second accommodation compartment through the fan compartment, and discharge from the second end; and
  - a second portion configured to enter the third accommodation compartment from the first end, enter the first accommodation compartment through the first connection port, flow to the second accommodation compartment through the fan compartment, discharge into the fourth accommodation compartment through the second connection port, and discharge from the second end.

14. The storage device of claim 12, wherein the chassis further comprises a backflow prevention plate rotatably disposed in the channel, and wherein when the first accommodation compartment is slidingly moved out of the chassis body:
the backflow prevention plate blocks a fifth end of the second accommodation compartment; and
the heat dissipation fan is configured to generate a cooling airflow that is configured to flow from the first accommodation compartment to the second accommodation compartment through the fan compartment, discharge into the fourth accommodation compartment through the channel, and discharge from the second end.

15. The storage device of claim 12, wherein the first accommodation compartment comprises a first connection port, and wherein, when the second accommodation compartment is slidingly moved out of the chassis body:
the first accommodation compartment is coupled to the fourth accommodation compartment through the connection port; and
the heat dissipation fan is configured to generate a cooling airflow that comprises:
a first portion configured to enter the first accommodation compartment from the first end through the channel, flow to the second accommodation compartment through the fan compartment, and then discharge; and
a second portion configured to enter the fourth accommodation compartment from the second end, enter the first accommodation compartment after passing through the first connection port, flow to the second accommodation compartment through the fan compartment, and then discharge.

16. The storage device of claim 10, wherein the channel is a straight channel.

17. The storage device of claim 10, wherein the channel is an arc channel.

18. The storage device of claim 10, wherein the first accommodation compartment and the second accommodation compartment are symmetrically disposed with respect to the fan compartment.

19. The storage device of claim 10, further comprising a circuit board assembly installed in the chassis.

20. The storage device of claim 19, further comprising:
a tank chain comprising:
a fifth end coupled to the chassis body; and
a sixth end fixedly coupled to the support; and
a plurality of cables installed on the tank chain,
wherein the circuit board assembly is electrically coupled to the hard disks through the cables.

* * * * *